(12) United States Patent
Cheng

(10) Patent No.: US 7,556,984 B2
(45) Date of Patent: Jul. 7, 2009

(54) PACKAGE STRUCTURE OF CHIP AND THE PACKAGE METHOD THEREOF

(75) Inventor: Joseph Cheng, TaoYuan (TW)

(73) Assignee: Boardtek Electronics Corp., Tao Yuan (TW)

( * ) Notice: Subject to any disclaimer, the term of this patent is extended or adjusted under 35 U.S.C. 154(b) by 668 days.

(21) Appl. No.: 11/154,696

(22) Filed: Jun. 17, 2005

(65) Prior Publication Data

US 2006/0284292 A1    Dec. 21, 2006

(51) Int. Cl.
*H01L 21/44* (2006.01)
*H01L 21/48* (2006.01)

(52) U.S. Cl. .................... 438/112; 438/121; 438/126; 438/127; 257/784; 257/E21.502

(58) Field of Classification Search ......... 438/110–112, 438/121, 126, 127; 257/784, E21.502
See application file for complete search history.

(56) References Cited

U.S. PATENT DOCUMENTS

| | | | | |
|---|---|---|---|---|
| 5,976,912 A | * | 11/1999 | Fukutomi et al. | 438/110 |
| 6,001,671 A | * | 12/1999 | Fjelstad | 438/112 |
| 6,093,584 A | * | 7/2000 | Fjelstad | 438/127 |
| 6,746,897 B2 | * | 6/2004 | Fukutomi et al. | 438/110 |
| 6,821,821 B2 | * | 11/2004 | Fjelstad | 438/124 |
| 6,949,470 B2 | * | 9/2005 | Igarashi et al. | 438/754 |
| 7,165,316 B2 | * | 1/2007 | Fjelstad | 29/620 |
| 2002/0094606 A1 | * | 7/2002 | Fukutomi et al. | 438/110 |

* cited by examiner

*Primary Examiner*—Nitin Parekh
(74) *Attorney, Agent, or Firm*—Rosenberg, Klein & Lee

(57) ABSTRACT

For a package structure of chip and the formation thereof, adhesive, conductive and metal layers are positioned on a substrate. The portions of the conductive and metal layers are removed to form multitudes of trenches therethrough, so that the metal layer is divided into chip supporters and conductive nodes isolated or electrical coupled each another. A chip is positioned on each of the chip supporter and electrically coupled to the conductive nodes. A molding compound covers the conductive layer, metal layer and chip. Then the substrate is removed. A dicing process as is applied with each chip or chipset as a unit to form the package structures of chip. There are advantages over improvement of reliability, reduction of package height, improve of level characteristic and heat dissipation, which may be applied to different types of semiconductor package.

44 Claims, 17 Drawing Sheets

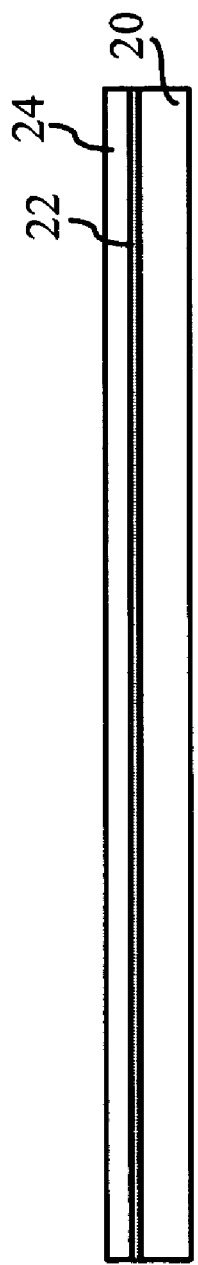
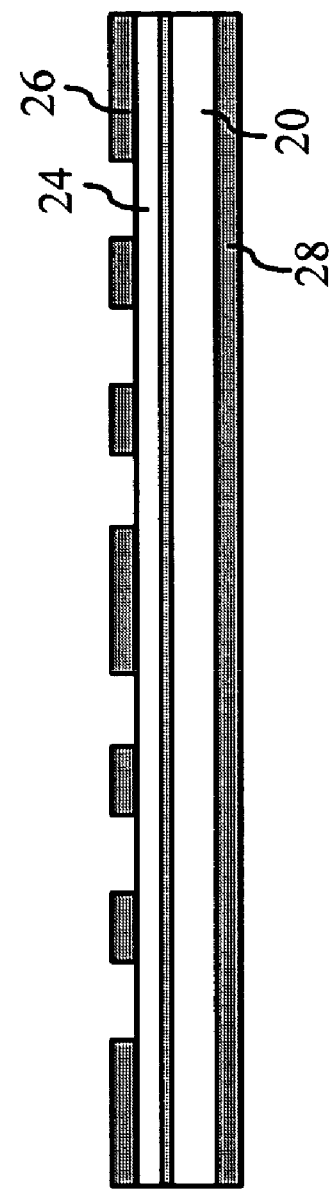
Fig.1(a)
Fig.1(b)

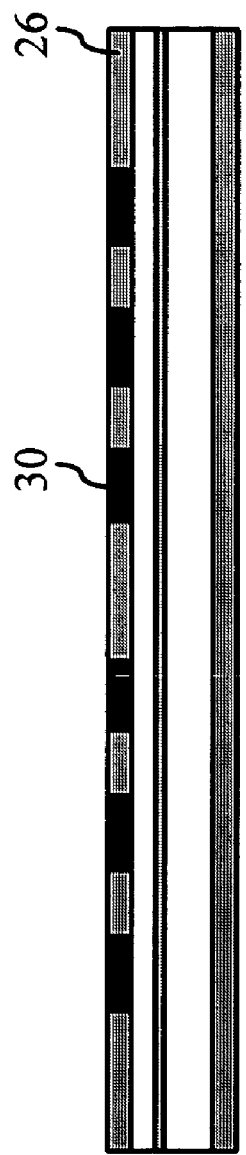
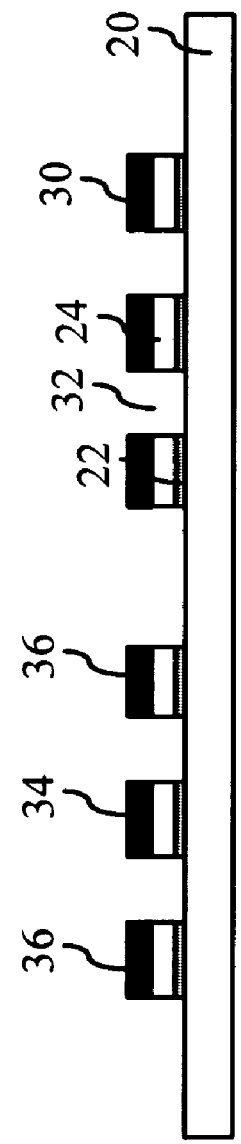

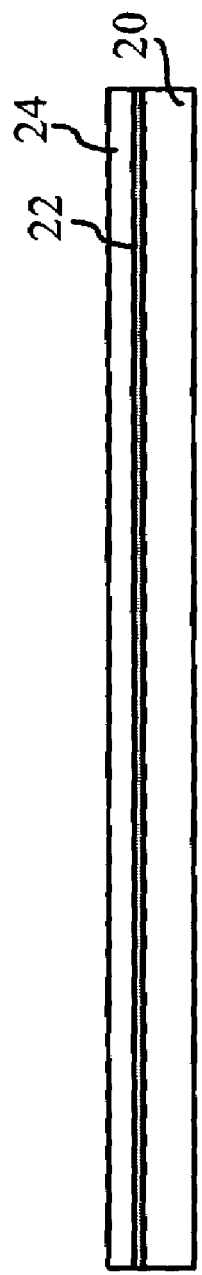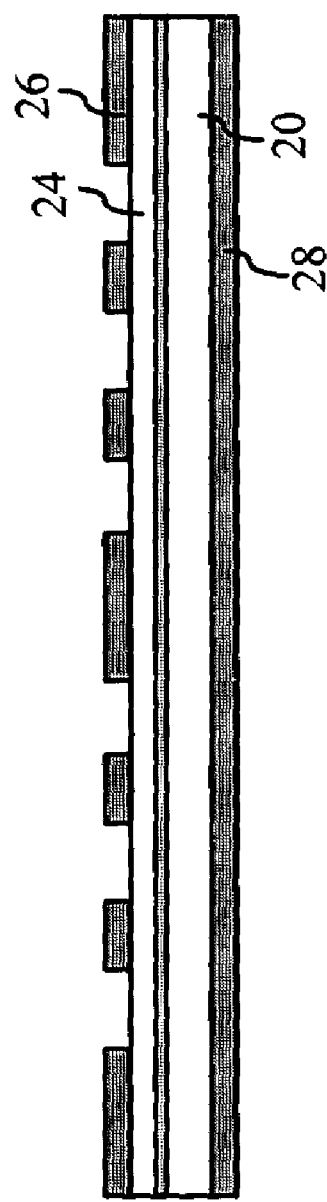
Fig.3(a)
Fig.3(b)

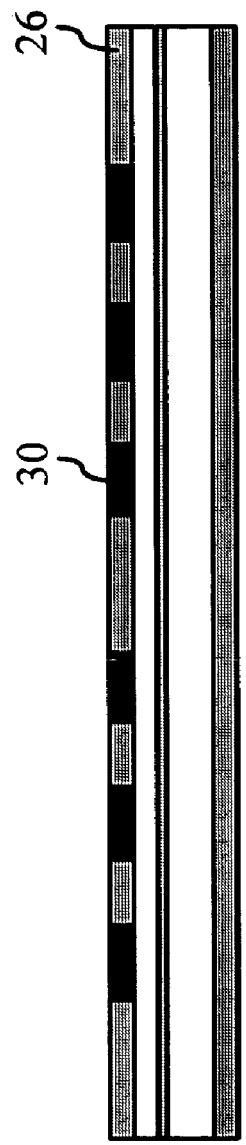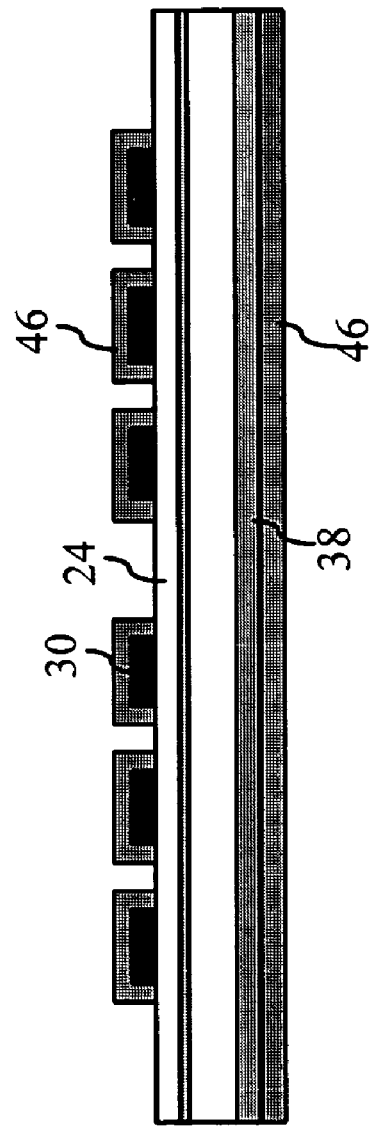

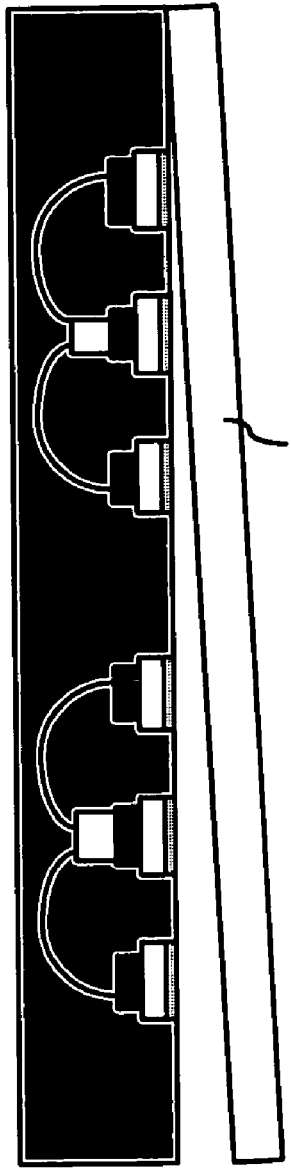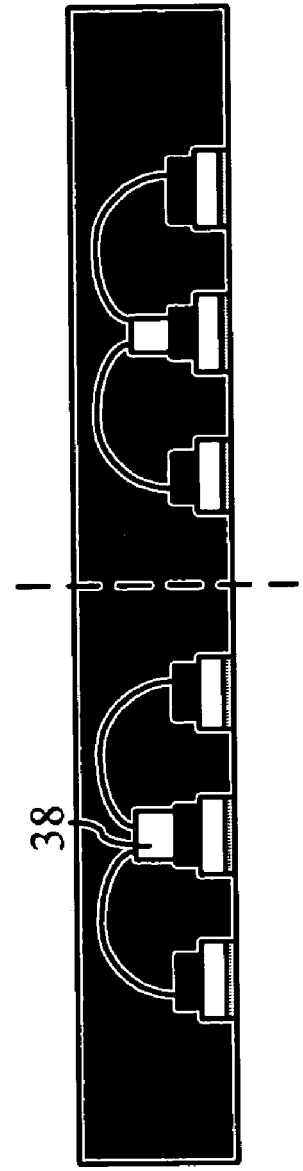
Fig.3(g)
Fig.3(h)

PACKAGE STRUCTURE OF CHIP AND THE PACKAGE METHOD THEREOF

BACKGROUND OF THE INVENTION

1. Field of the Invention

The invention relates generally to a package structure of chip and the package method thereof. In particular, the invention relates to a package structure of chip with more level surface and less height and the package method thereof.

2. Description of the Prior Art

With the rapid improvement of semiconductor technology, there are more and more requirements on the functions, portability and compact sizes for computers and telecommunication products. Accordingly, the manufacturers of chip package develop technology to produce the products with high power, high integrity, light and small size. Moreover, for electronics packaging, there are higher requirements on reliability and heat dissipation to be capable of transmitting signals and energy, providing good path of heat dissipation, protecting and supporting.

It is a trend to produce package elements of semiconductor with compact sizes, rapid speed and high integrity. However, the power consumption becomes a heavy load. Thus, it is an important issue on the heat dissipation for package elements.

Nowadays in processing printed circuit boards, each element is attached on the printed circuit board with soldering. Thus, when attached any element, the printed circuit board needs a well level surface to meet the high reliability of electrical element.

Accordingly, it is important to provide an improved package structure of chip and the formation thereof.

SUMMARY OF THE INVENTION

One of the embodiments of the present invention provides a package method for a package structure. A substrate is used as a supporter to load package elements and then removed during subsequent process, so as to provide the stable structure and improve the reliability during the package process. Such as a printed circuit board with high-quality level surface may meet a severe requirement on smooth quality.

The other one of the embodiments of the present invention provides a package method for a package structure. A forming process may be repeatedly applied to the package structure to form a stacked structure for multiplayer printed circuit board. Such a package method may be applied to many types of semiconductor package.

Another one of the embodiment of the present invention is to provide the package structure of chip and the formation thereof. One chip is positioned on the chip supporter of a metal layer to improve the heat dissipation. Moreover, the conductive nodes provide the heavy amount of leads.

The other one of embodiments of the present invention is to provide the package structure with the height reduction. With the height in micrometers, the package structure compared to the conventional one may reduce the whole height of package structure.

Accordingly, a package method for a chip is provided. A substrate is provided with at least one adhesive layer and at least one conductive layer subsequently thereon. A patterned layer is formed on the conductive layer and a film on the bottom surface of the substrate. At least one metal layer is filled into the patterned layer. The patterned layer and the film are formed. The portions of the conductive layer are removed to form a plurality of trenches through the conductive layer on the substrate, wherein the trenches divide the metal layer into a plurality of chip supporters and conductive nodes isolated each another. At least one chip is formed on each of the chip supporter, the chips electrically coupled to the conductive nodes, respectively. A molding compound is formed on the adhesive layer to encapsulate the conductive layer, the metal layer and the chips, and then the substrate is removed. Dicing is applied with each of chip or chipset as a unit to form a plurality of package structures of chip.

Accordingly, a package structure of chip is provided to comprise a chip supporter. A plurality of conductive nodes isolated are positioned around the chip supporter, wherein the chip supporter and the conductive nodes include at least one conductive layer, at least one metal layer thereon, and a plurality of trenches through the conductive layer and metal layer to divide the chip supporter and the conductive nodes. At least one chip is positioned on the chip supporter and electrically coupled with conductive nodes. A molding compound is formed atop the surface of the conductive layer to encapsulate the metal layer and the chip.

The foregoing aspects and many of the attendant advantages of this invention will become more readily appreciated as the same becomes better understood by reference to the following detailed description, when taken in conjunction with the accompanying drawings.

BRIEF DESCRIPTION OF THE DRAWINGS

FIG. 1(a) to FIG. 1(h) are cross-sectional diagrams illustrating a package method in accordance with one embodiment of the present invention.

FIG. 3(a) to FIG. 3(i) are cross-sectional diagrams illustrating a package method in accordance with another one embodiment of the present invention.

FIG. 7 is a cross-sectional diagram illustrating the trenches filled with the adhesive and conductive layer in accordance with one embodiment of the present invention.

FIG. 8 to 11 and FIG. 12-14 are cross-sectional diagrams illustrating different types of package structures from FIGS. 5 and 10 in accordance with embodiments of the present invention.

DESCRIPTION OF THE PREFERRED EMBODIMENTS

Figure 1E:
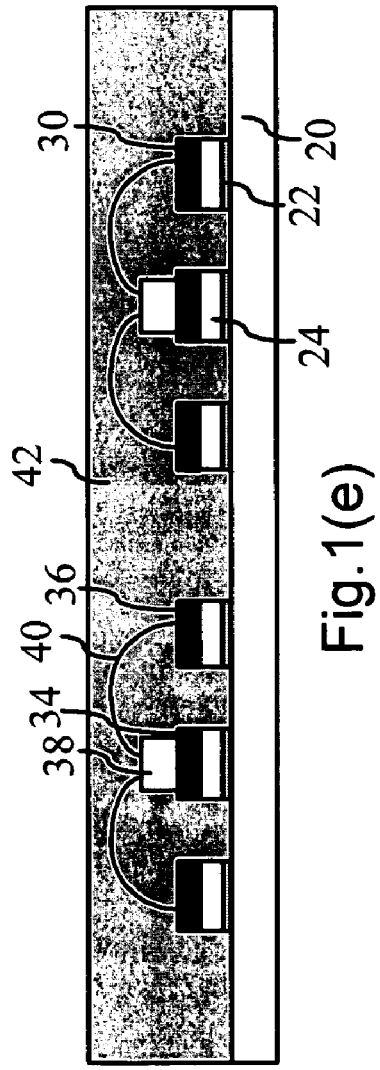
Figure 1F:
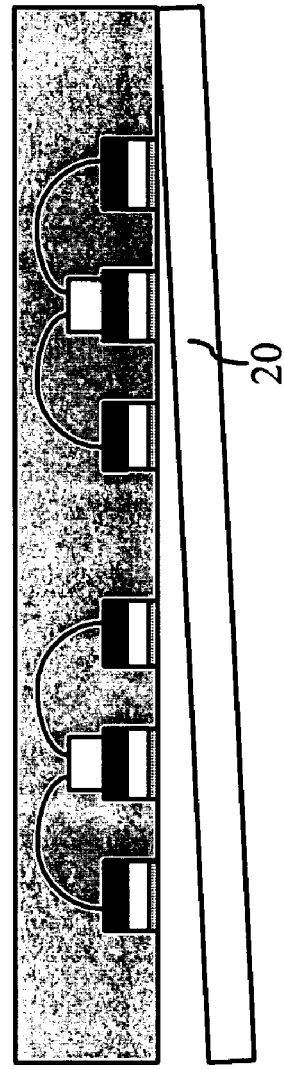

Before describing the invention in detail, a brief discussion of some underlying concepts will first be provided to facilitate a complete understanding of the invention.

FIG. 1(a) to FIG. 1(h) are cross-sectional diagrams illustrating the steps performing the package of a chip in accordance with the present invention. Shown in FIG. 1(a), a substrate 20, made of metal, glass, ceramic or polymer, is provided for subsequently applying an adhesive layer 22 and a conductive layer 24 on the substrate 20. In one of the embodiments, the substrate 20, adhesive layer 22 and conductive layer 24 are configured as a whole unity or a massive product. Alternatively, the adhesive layer 22, made of metal, conductive material or polymer, is formed on the substrate 20 by attaching, printing, spin-coating, sputtering, non-electroplating or electroplating method. Next, the conductive layer 24 is formed on the adhesive layer 22 by the similar method such as attaching, printing, spin-coating, sputtering, non-electroplating or electroplating.

Depicted as FIG. 1(b), a patterned film 26 and another film 28 are formed on the conductive layer 24 and 28, respectively. Next, show in FIG. 1(c), one or more metal layers 30 are filled into the patterned film 26. The portions of the patterned film 26 and the whole film 28 are removed with the metal layer 30 as a mask. The procedure of etching or deep-etching is applied to the adhesive layer 22 and conductive layer 24 to form one or more patterned trenches 32 on the substrate 20. The metal layer 30 is divided into the chip supporter 34 and the regions of conductive nodes 36 isolated or coupled each another, shown as FIG. 1(d).

Next, shown as FIG. 1(e), one or more chips 38 attached on each or one of the chip supporter 34 are electrically coupled to the conductive nodes 36 with multitudes of conductive wires 40 made of metal. A molding compound 42 on the adhesive layer 22 encapsulates the conductive layer 24, metal layer 30 and the chip 38 or adhesive layer 22. Next, shown as FIG. 1(f), the substrate 20 is removed to form the structure as FIG. 1(g). Along with the dash line, the dicing procedure is employed to form the units of chip 38 or chip sets, shown as the structure of chip package of FIG. 1(h).

Figure 1G:
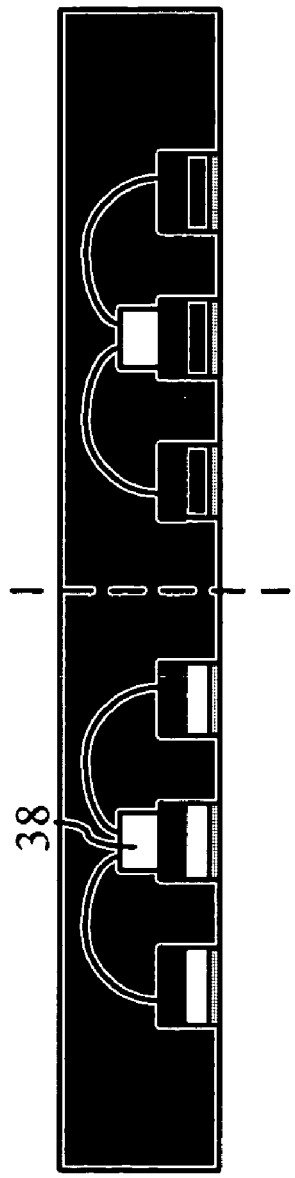
Figure 1H:
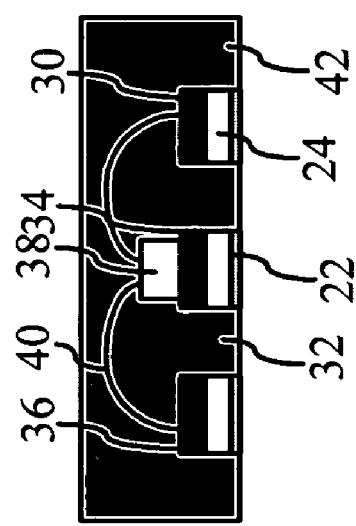

The structure of chip package in FIG. 1(h) includes the chip supporter 34 surrounded by the conductive nodes 36 electrically isolated or coupled each another. Each of chip supporter 34 or each of conductive nodes 36 is consisted of the adhesive layer 22, conductive layer 24 and the metal layer 30. Each of the patterned trenches 32 is formed between the chip supporter 34 and conductive nodes 36 for separating the chip supporter 34 from conductive nodes 36. One or more chip 38 are positioned on one of the chip supporter 34 and electrically coupled to one or more conductive nodes 36 with the conductive wires 40. The molding compound 42 on the top surface of the adhesive layer 22 encapsulate the conductive layer 24, metal layer 30 and chip 38 or adhesive layer 22.

Figure 2:
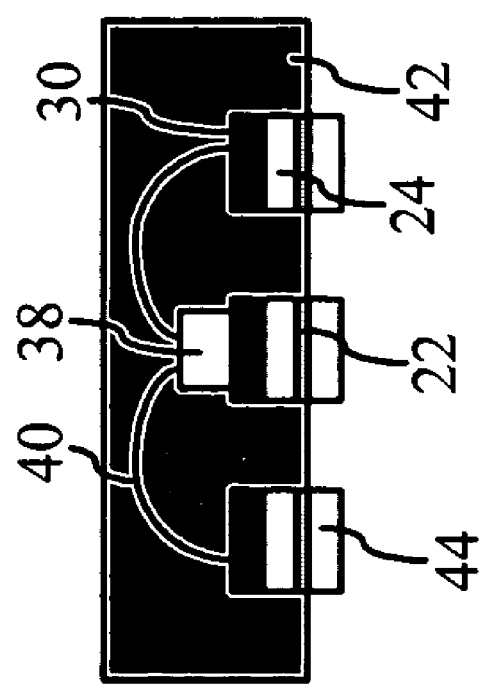
FIG. 2 is a cross-sectional diagram illustrating a package structure in accordance with one embodiment of the present invention.

Before or after the dicing step as FIG. 1(g), multitudes of bumps 44 are positioned under the adhesive layer 22 and exposed to the bottom side of the molding compound 42, shown as FIG. 2. The bumps 44 are configured for soldering onto other exterior electrical apparatus. All of the elements exclusive of the bumps 44 are identical to ones shown in FIG. 1(h) and not illustrated herein.

Figure 3E:
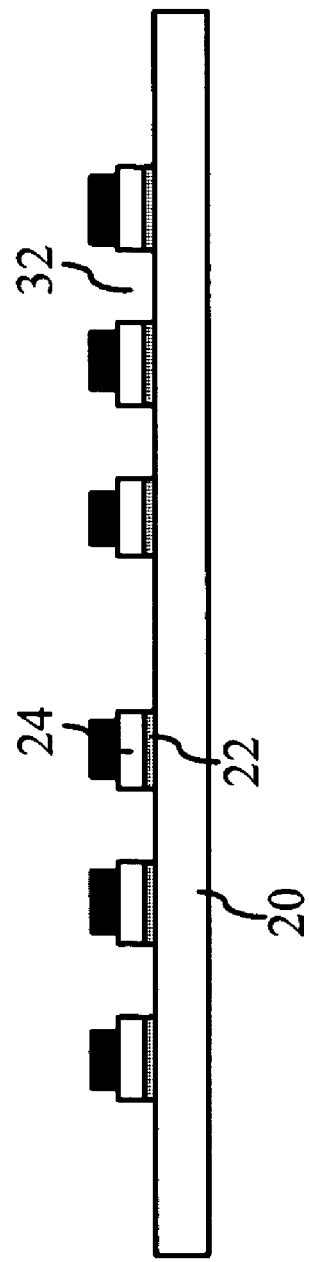
Figure 3F:
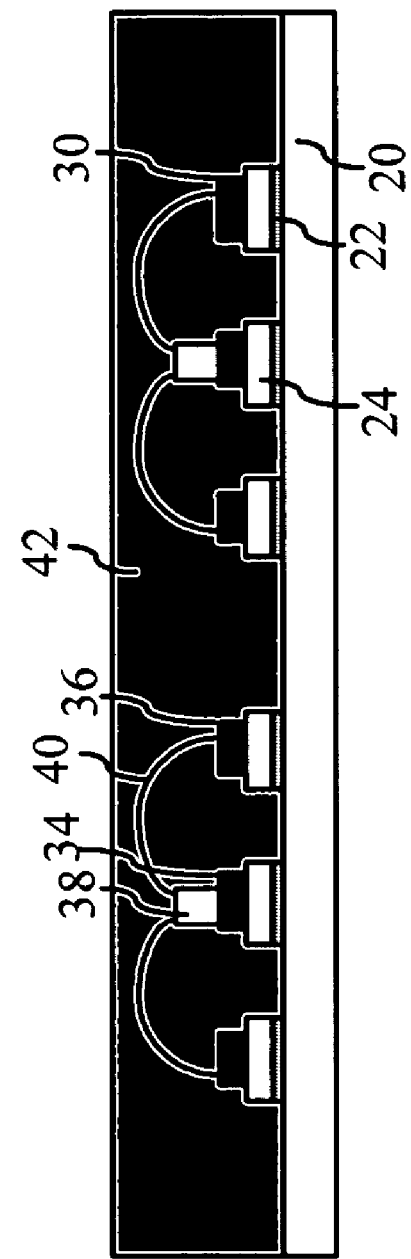
Figure 3I:
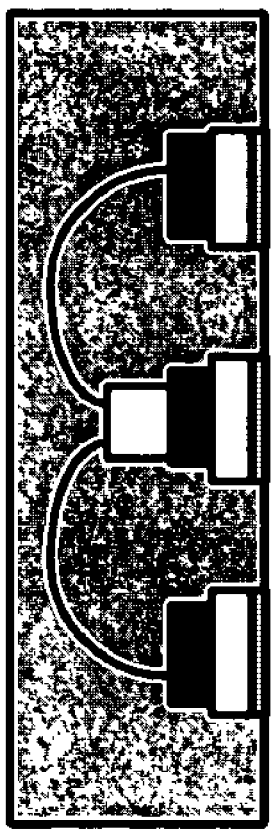

FIG. 3(a) to FIG. 3(i) are cross-sectional diagrams illustrating the package method in accordance with one embodiment of the present invention. The steps employed shown in from FIG. 3(a) to FIG. 3(c) are similar as ones in from FIG. 1(a) to FIG. 1(c) and not illustrated for simplification. It is noted that the metal layer 30 is filled into the patterned film 26 followed by the removal of the patterned film 26 and chip 38, in this embodiment. Shown in FIG. 3(d), with the pattern-transferring method, the passivation layers 46 cover over the metal layer 30 of the conductive layer 24 and the bottom side of the substrate 20, respectively. Next, the deep-etching is applied to the substrate 20 to form the patterned trenches 32 through the adhesive layer 22 and conductive layer 24, and then the passivation layer 46 is removed to expose the portions of the conductive layer 24, shown in FIG. 3(e). The package structure of chip shown in FIG. 3(i) is implemented through the steps shown from FIG. 3(f) to FIG. 3(h). The difference in structures between FIGS. 1(h) and 3(i) is that the partial surfaces of the conductive layer 24 are exposed to the metal layer 30 during the formation of the patterned trenches 32. Moreover, the bumps 44 may be configured under the adhesive layer 22 before or after the dicing step.

Figure 4:
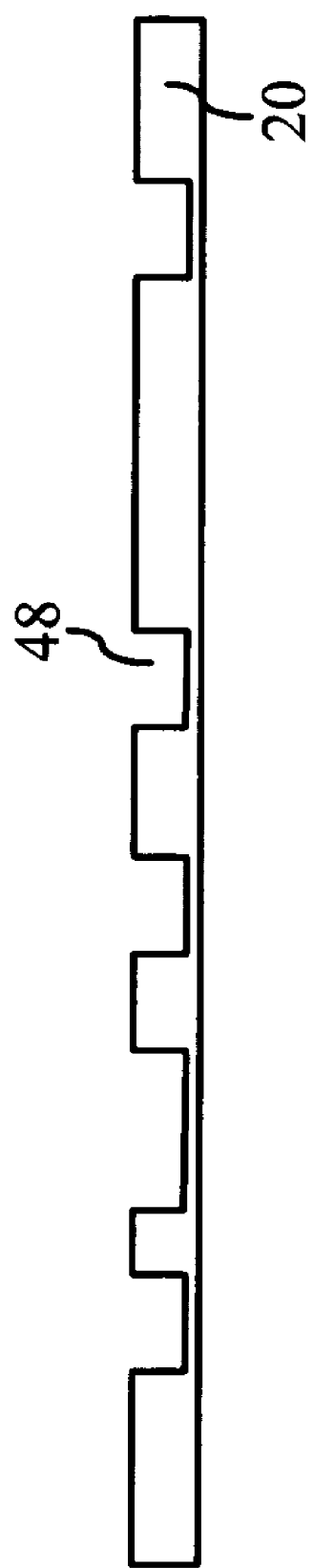
FIG. 4 is a cross-sectional diagram illustrating a substrate with trenches in accordance with one embodiment of the present invention.
Figure 5:
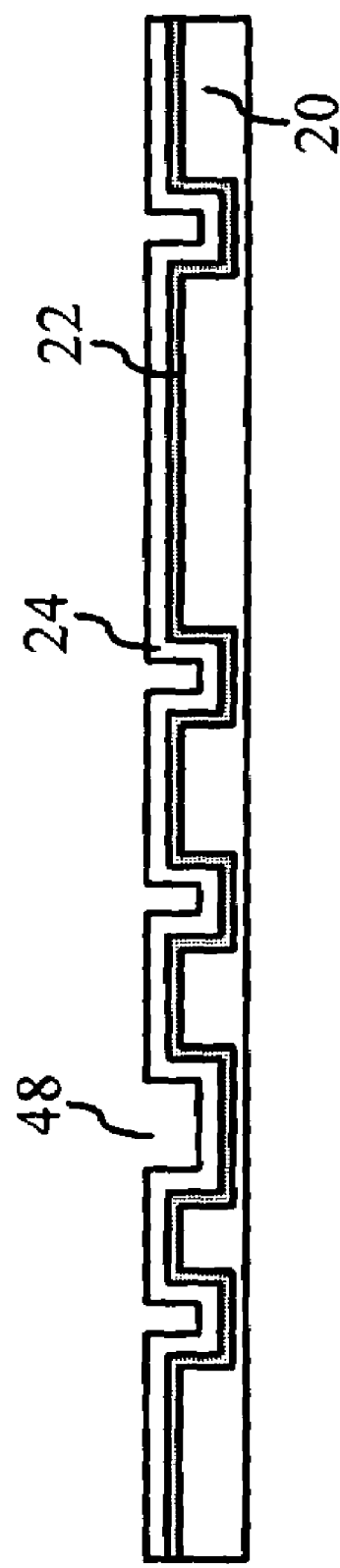
FIG. 5 is a cross-sectional diagram illustrating the trenches through the adhesive and conductive layer in accordance with one embodiment of the present invention.
Figure 6:
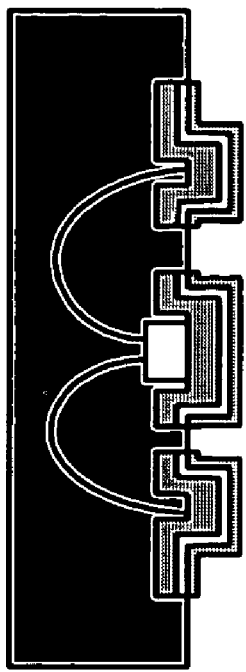
FIG. 6 to FIG. 9 are cross-sectional diagrams illustrating different types of package structures from FIG. 5 in accordance with one embodiment of the present invention.
Figure 7:
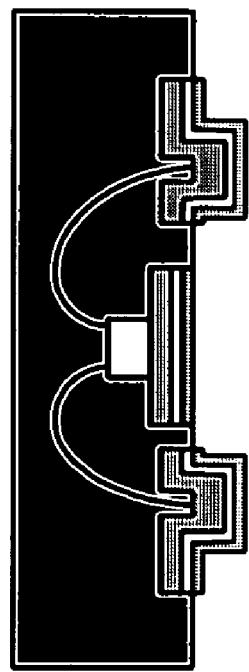
Figure 8:
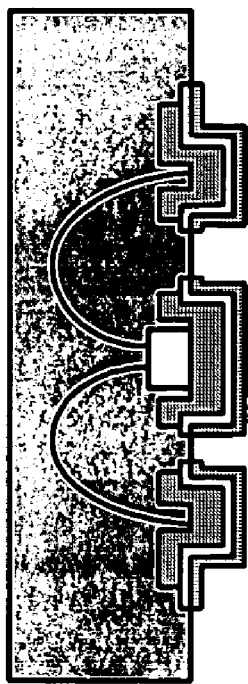
Figure 9:
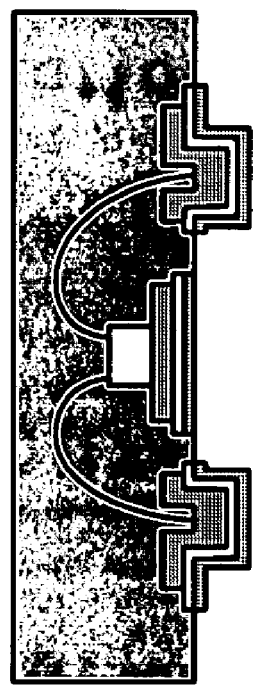
Figure 10:
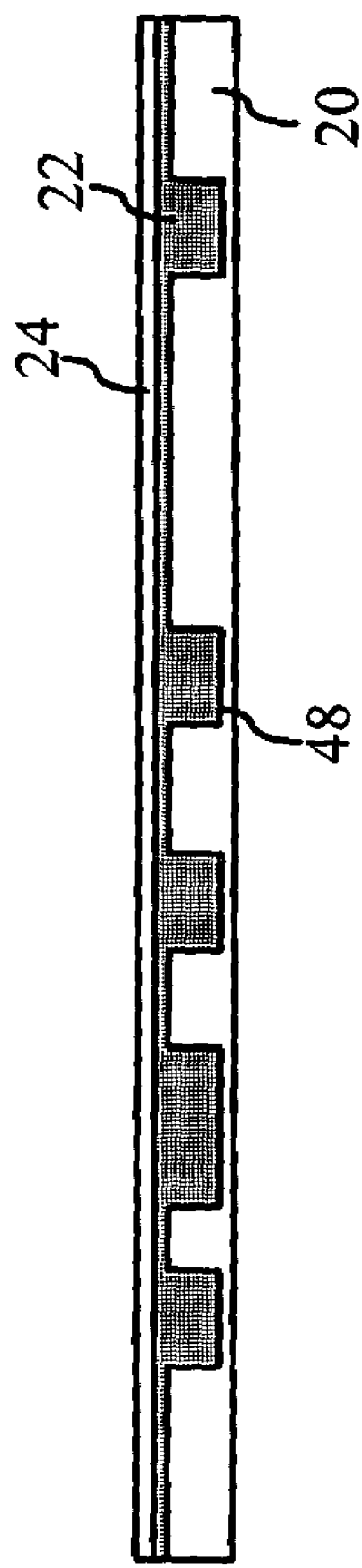
Figure 11:
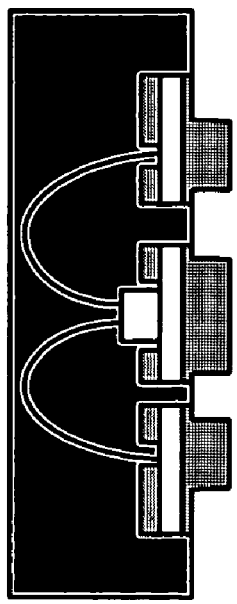
Figure 12:
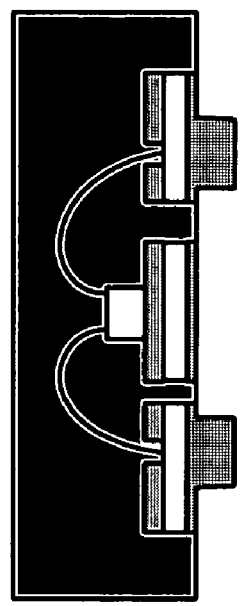
Figure 13:
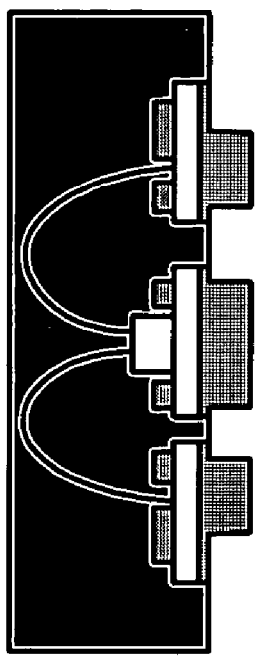
Figure 14:
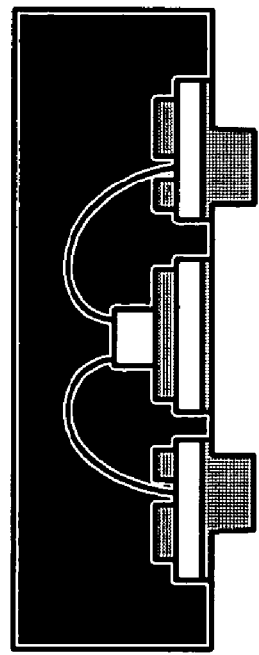

In this embodiment, with the deep-etching or etching methods, the substrate 20 aforementioned may be partially removed to form multitudes of trenches 48, shown in FIG. 4. Both of the adhesive layer 22 and conductive layer 24 are conformally formed into the trenches 48 and onto the substrate 20, shown in FIG. 5. The package steps from FIG. 1(b) to FIG. 1(g) are employed to transfer patterns into the patterned film 26 and film 28 for forming multitudes of patterned trenches 32. After the removal of the patterned film 26 and film 28, the chip 38, conductive wires 40 and molding compound 42 are subsequently employed onto the structure and then the substrate 20 is removed. Similarly, the dicing step is applied to the structure to form the chip or chip set 38, shown as FIGS. 6 and 7. Moreover, similar as the steps from FIG. 3(b) to FIG. 3(h), the patterned film 26 and film 28 is pattern-transferred, followed by the formation of the passivation layer 46. Next, the patterned trenches 32 are pattern-transferred formed followed by the removal of the passivation layer 46, patterned film 26 and film 28. The chip 38, conductive wires 40 and molding compound 42 are subsequently configured followed by the removal of the substrate 20. The dicing step are applied to the whole structure to form chip unit or chip set 38, shown as the package structures in FIGS. 8 and 9. It is note that, for the package structures in FIGS. 6 and 9, the portions of the adhesive layer 22, conductive layer 24 and metal layer 30 are exposed to the molding compound 42. Alternatively, the deep-etching or etching method is first applied to the substrate 20 to form multitudes of trenches 48, shown as FIG. 4. Then the adhesive layer 22 or conductive layer 24 is filled into or up the trenches 48, shown as FIG. 10. Next, the package process is employed as the steps from FIG. 1(b) to FIG. 1(g) or from FIG. 3(b) to FIG. 3(h), so as to form the package structures as FIGS. 11 and 14. For the package structure as FIG. 11 or FIG. 14, the portions of the adhesive layer 22 and conductive layer 24 are exposed to the molding compound 42.

Alternatively, for all of the package processes aforementioned, the adhesive layer 22 and substrate 20 may be removed at the same time. That is, the package structure without the adhesive layer 22 may include the chip supporter 34 and multitudes of conductive nodes 36 around isolated or coupled each another. Each of the chip supporter 34 or conductive nodes 36 is consisted of the conductive layer 24 and the metal layer 30 thereon. Multitudes of patterned trenches 32 through the conductive layer 24 and metal layer 30 separate the chip supporter 34 from the conductive nodes 36. One or more chips 38 are positioned on the chip supporter 34 and electrically coupled to the conductive nodes 36. Before the repeated settlement of the chips 38, the molding compound 42 may be formed on the top surface of the conductive layer 24 to encapsulate the metal layer 30 and chip 38. Then the steps after the formation of stacked structure are implemented after the settlement of the chip 38.

A package method for a package structure of chip is provided herein. During the package process, a substrate is used for supporting elements, which has one or more conductive layers with or without an adhesive layer. Moreover, the package element and patterned traces are implemented on the substrate, and then the substrate is removed. With the help of the substrate, the reliability of the package structure is improved and a good surface is beneficial for the subsequent steps to meet high requirement for a printed circuit board (PCB). With the application of the package steps, a stacked structure may be formed with repeated stacking steps to form a multi-layer PCB. Such a package structure may fit to the semiconductor package and be with efficient heat dissipation.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A package method for a chip, comprising steps in an order of:
   providing a substrate with at least one adhesive layer and at least one conductive layer subsequently thereon;
   forming a patterned layer on the conductive layer and a film on a bottom surface of the substrate;
   filling at least one metal layer into the patterned layer;
   removing the patterned layer and the film;
   removing portions of the conductive layer and the adhesive layer to form a plurality of trenches through the conductive layer and the adhesive layer on the substrate, wherein the trenches divide the metal layer into a plurality of chip supporters and conductive nodes isolated from each another;
   forming at least one chip on each of the chip supporter, a plurality of chips electrically coupled to the conductive nodes, respectively;
   forming a molding compound on the substrate to encapsulate the conductive layer, the metal layer and the chips;
   removing the substrate; and
   dicing with each of chip or chipset as a unit to form a plurality of package structures of the chip.

2. The package method of the claim 1, wherein the substrate is made of metal, glass, ceramic, or polymer.

3. The package method of the claim 1, wherein the substrate has a plurality of trenches therein, and the portions of the adhesive layer, the portions of the conductive layer and the portions of the metal layer are exposed to the molding compound.

4. The package method of the claim 3, wherein the adhesive layer and the conductive layer are filled into the trenches.

5. The package method of the claim 1, wherein the substrate, the adhesive layer and the conductive layer are formed as a whole unity.

6. The package method of the claim 1, wherein the adhesive layer are positioned on the substrate by adhering, coating, evaporating, sputtering, non-electroplating or electroplating.

7. The package method of the claim 1, wherein the conductive layer are positioned on the adhesive layer by adhering, coating, evaporating, sputtering, non-electroplating or electroplating.

8. The package method of the claim 1, wherein the patterned layer and the film are formed by pattern transference.

9. The package method of the claim 1, wherein the trenches are implemented by laser micro-machining, etching or deep-etching.

10. The package method of the claim 1, further comprising forming a passivation layer on the conductive layer or the metal layer after the step of filling the metal layer into the patterned layer, wherein the conductive layer on the conductive layer covers the metal layer filled into the patterned layer.

11. The package method of the claim 10, further comprising removing the passivation layer after the formation of the trenches.

12. The package method of the claim 1, where the portions of the conductive or the adhesive layer are exposed during the formation of the trenches through the conductive layer on the substrate.

13. The package method of the claim 1, before the dicing step, further comprising forming a plurality of bumps exposed to and on the bottom side of the adhesive layer.

14. The package method of the claim 13, wherein the bumps are made from conductive or metal material.

15. The package method of the claim 1, after the dicing step, further comprising forming a plurality of bumps on the bottom side of the adhesive layer and exposed to the bottom side of the molding compound.

16. The package method of the claim 13, wherein the bumps are positioned on the adhesive layer by attaching, printing, evaporating, sputtering, non-electroplating or electroplating.

17. The package method of the claim 15, wherein the bumps are positioned on the adhesive layer by attaching, printing, evaporating, sputtering, non-electroplating or electroplating.

18. The package method of the claim 15, wherein the bumps are made from conductive or metal material.

19. The package method of the claim 1, wherein a plurality of bumps are formed to electrically couple the respective chips with the conductive nodes.

20. The package method of claim 1, wherein a plurality of wires are formed to electrically couple the respective chips with the conductive nodes.

21. The package method of the claim 1, wherein comprising removing the portions of the adhesive layer and the conductive layer to form a plurality of trenches through the adhesive layer and the conductive layer on the substrate.

22. The package method of the claim 1, wherein the adhesive layer is removed during the step of removing substrate.

23. The package method of the claim 1, wherein the metal layer is used as a mask during the step of forming the trenches.

24. The package method of the claim 1, further comprising:
   respectively forming a second patterned layer and a second film on both the conductive layer and the metal layer on the bottom surface of the substrate;
   forming the trenches with the second patterned layer as a mask; and
   removing the second patterned layer and the second film.

25. A package method for a chip, comprising steps in an order of:
   providing a substrate with at least one conductive layer thereon;
   forming a patterned layer on the conductive layer and a film on a bottom surface of the substrate;
   filling at least one metal layer into the patterned layer;
   removing the patterned layer and the film;
   removing portions of the conductive layer to form a plurality of trenches through the conductive layer on the substrate, wherein the trenches divide the metal layer into a plurality of chip supporters and conductive nodes isolated from each another;
   forming at least one chip on each of the chip supporter, a plurality of chips electrically coupled to the respective conductive nodes, respectively;
   forming a molding compound on the substrate to encapsulate the conductive layer, the metal layer and the chips;
   removing the substrate; and
   dicing with each of chip or chipset as a unit to form a plurality of package structures of the chip.

26. The package method of the claim 25, wherein the substrate has a plurality of trenches therein, and the portions of the conductive layer and the portions of the metal layer are exposed to the molding compound.

27. The package method of the claim 26, wherein the conductive layer is filled into or up the trenches.

28. The package method of the claim 25, wherein the substrate and the conductive layer are formed as a whole unity.

29. The package method of the claim 25, wherein the conductive layer is set on the substrate by adhering, coating, evaporating, sputtering, non-electroplating or electroplating.

30. The package method of the claim 25, wherein the patterned layer and the film are formed by pattern transference.

31. The package method of the claim 25, wherein the trenches are formed by laser micro-machining, etching or deep-etching.

32. The package method of the claim 25, further comprising forming a passivation layer on the conductive layer or the metal layer after the step of filling the metal layer into the patterned layer, wherein the conductive layer on the conductive layer covers the metal layer filled into the patterned layer.

33. The package method of the claim 32, further comprising removing the passivation layer after the formation of the trenches.

34. The package method of the claim 25, where the portions of the conductive layer are exposed during the formation of the trenches through the conductive layer on the substrate.

35. The package method of the claim 25, further comprising positioning a plurality of bumps on the conductive layer to be exposed to the bottom of the molding compound before the steps of dicing and forming the package structure.

36. The package method of the claim 25, further comprising positioning a plurality of bumps on the conductive layer to be exposed to the bottom of the molding compound after the steps of dicing and forming the package structure.

37. The package method of the claim 35, wherein the bumps are positioned on the conductive layer by attaching, printing, evaporating, sputtering, non-electroplating or electroplating.

38. The package method of the claim 36, wherein the bumps are positioned on the conductive layer by attaching, printing, evaporating, sputtering, non-electroplating or electroplating.

39. The package method of the claim 35, wherein the bumps are made from conductive or metal material.

40. The package method of the claim 36, wherein the bumps are made from conductive or metal material.

41. The package method of the claim 25, wherein a plurality of bumps are formed to electrically couple the respective chips with the conductive nodes.

42. The package method of the claim 25, wherein a plurality of wires are formed to electrically couple the respective chips with the conductive nodes.

43. The package method of the claim 25, wherein the metal layer is used as a mask during the step of forming the trenches.

44. The package method of the claim 25, further comprising:
    respectively forming a second patterned layer and a second film on both the conductive layer and the metal layer on the bottom surface of the substrate;
    forming the trenches with the second patterned layer as a mask; and
    removing the second patterned layer and the second film.

* * * * *